(12) United States Patent
Lee

(10) Patent No.: US 6,215,690 B1
(45) Date of Patent: Apr. 10, 2001

(54) SEMICONDUCTOR MEMORY DEVICES HAVING SHARED DATA LINE CONTACTS

(75) Inventor: Jung-Hwa Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/536,963

(22) Filed: Mar. 28, 2000

Related U.S. Application Data

(63) Continuation of application No. 09/145,905, filed on Sep. 2, 1998, now Pat. No. 6,058,064.

(30) Foreign Application Priority Data

Apr. 9, 1997 (KR) .................................................. 97-45864

(51) Int. Cl.[7] .................................................. G11C 7/00
(52) U.S. Cl. .......................... 365/63; 356/230.03; 356/51
(58) Field of Search ................................ 365/51, 63, 207, 365/230.01, 230.03

(56) References Cited

U.S. PATENT DOCUMENTS

| 5,235,550 | 8/1993 | Zagar | 365/226 |
| 5,774,408 | 6/1998 | Shirley | 365/230.03 |
| 6,125,070 | * | 9/2000 | Tomishima | 365/230.03 |

* cited by examiner

Primary Examiner—Terrell W. Fears
(74) Attorney, Agent, or Firm—Myers Bigel Sibley & Sajovec

(57) ABSTRACT

Disclosed herein is a semiconductor memory device which comprises a memory cell array having a plurality of memory cells and a plurality of bit line pairs connected to the memory cells. The device has two data line pairs corresponding to the memory cell array. Furthermore, the device comprises a plurality of selecting transistors connected to the bit line pairs and selecting two bit line pairs to connect the two selected bit line pairs to the two data line pairs in response to a column selection signal. The selecting transistors corresponding to the column selection signal are laid out to share source/drain to data line contacts with contiguous those to be selected by another column selection signal.

7 Claims, 5 Drawing Sheets

Y=2L+2S

Y'=3/2L+α+2S $Y'' = L + 2\alpha + S$

SEMICONDUCTOR MEMORY DEVICES HAVING SHARED DATA LINE CONTACTS

This Application is a continuation of Ser. No. 09/145,905 filed Sep. 2, 1998 now U.S. Pat. No. 6,058,064.

FIELD OF THE INVENTION

The present invention relates to a semiconductor memory device and, more particularly to a dynamic random access memory device having shared data line contacts.

BACKGROUND OF THE INVENTION

As a fabrication process technics has been enhanced, the degree of integration of a semiconductor memory device in particular a dynamic random access memory DRAM device has been increased. As such a result, a size of each memory cell thereof and a space (or "pitch") between each bit line pair thereof have been reduced. As well-known, the DRAM device uses a folded bit line scheme and a shared sense amplifier scheme to lay out the sense amplifier within a reduced pitch. This is disclosed in U.S. Pat. No. 5,774,408, entitled "DRAM ARCHITECTURE WITH COMBINED SENSE AMPLIFIER PITCH". The DRAM device comprises bit line isolation transistors, bit line equalization transistors, p-latch sense amplifier, selecting transistors, and n-latch sense amplifier, which are corresponding to a bit line pair consisting of true and complementary bit lines (e.g., BL and BLB).

FIG. 1 shows a prior art layout arrangement of transistors (also, column selecting transistors) for selecting a bit line pair so as to be connected to corresponding data line pair (not shown). In FIG. 1, a reference symbol Y indicates a pitch within which four bit line pairs (i.e., eight bit lines) are laid out, a reference symbol S indicates a space between active areas 1 in which the selecting transistors are formed respectively, and a reference symbol L indicates a length (in which a selecting transistor having a source, a drain and a channel is formed) of each active area 1. Wherein the length L can be determined by a gate length, bit line to source contact area, drain to data line contact area, a space between the gate and the contact areas, and spaces between the contact areas and the drain and between the contact areas and the source. According to the prior art of FIG. 1, it can be seen that the selecting transistors corresponding to a bit line pair (or two bit line pairs) are laid out within a pitch Y of (2L+2S) in which eight bit lines, that is, four bit line pairs, are laid out.

The arrangement of the selecting transistors connected to bit lines is restricted by the space between bit lines of any one of bit line pairs. If the degree of integration is increased more and more, the space therebetween is also reduced, making it impossible that the selecting transistors are laid out within the space or pitch (2L+2S).

Referring to FIG. 2 according to another prior art, a layout arrangement of transistors for selecting bit line pair so as to be connected to corresponding data line pair is to lay out the selecting transistors within a pitch Y' less than 2L. In this case, the selecting transistors are laid out within the pitch Y' of (3/2L(L+L/2)+2S+α wherein, L>(L/2+α)>L/2) less than (2L+2S) of FIG. 1.

The higher the degree of integration of the DRAM device, the less a size of each memory cell therein and a space between bit lines. In this case, it is impossible that the selecting transistors are laid out the pitch Y', that is, (3/2L+2S+α). Therefore, it is needed to ensure the selecting transistor area so as to be laid out within a pitch less than (3/2L+2S+α).

SUMMARY OF THE INVENTION

It is therefore an object of the present invention to provide a semiconductor memory device with source/drain to data line contacts which are shared by adjacent selecting transistors.

In order to attain the above objects, according to an aspect of the present invention, there is provided a semiconductor memory device. The device comprises a memory cell array having a plurality of memory cells, a plurality of bit line pairs connected respectively to the memory cells, and at least two data line pairs corresponding to the memory cell array. Furthermore, the device comprises a plurality of selecting transistors connected to the bit line pairs and selecting two bit line pairs to connect the two selected bit line pairs to the two data line pairs in response to a column selection signal. Wherein, the selecting transistors corresponding to the column selection signal are laid out to share source/drain to data line contacts with contiguous those to be selected by another column selection signal.

In the semiconductor memory device according to the invention, the selecting transistors corresponding to the column selection signal are laid out to have a pitch of four times one of the bit line pairs.

Furthermore, in the semiconductor memory device, the bit line pairs corresponding to the column selection signal are laid out to have a symmetrical arrangement with regarding to bit line pairs corresponding to the another column selection signal.

Still further, in the semiconductor memory device, the bit line pairs corresponding to the column selection signal are laid out to have a complementarily symmetrical arrangement with regarding to bit line pairs corresponding to the another column selection signal.

BRIEF DESCRIPTION OF THE DRAWINGS

The present invention will be described by way of exemplary embodiments, but not limitations, illustrated in the accompanying drawings in which like reference denote similar elements, and in which.

DESCRIPTION OF PREFERRED EMBODIMENTS

The present invention will now be described more fully hereinafter with reference to the accompanying drawings, in which preferred embodiments of the invention are shown.

This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 4:
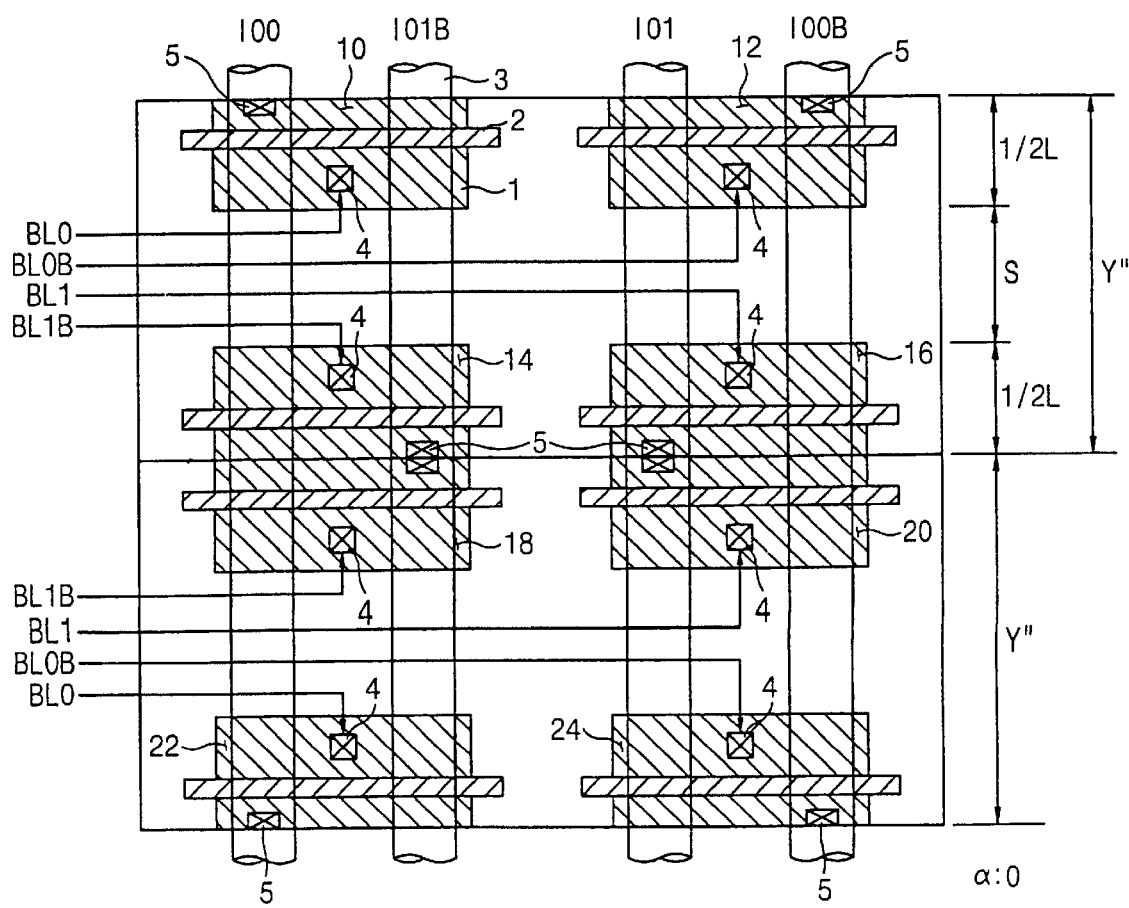
FIG. 4 shows a layout arrangement diagram of selecting transistors corresponding to two column selection signals CSLi and CSLj according to a first embodiment of the present invention.
Figure 5:
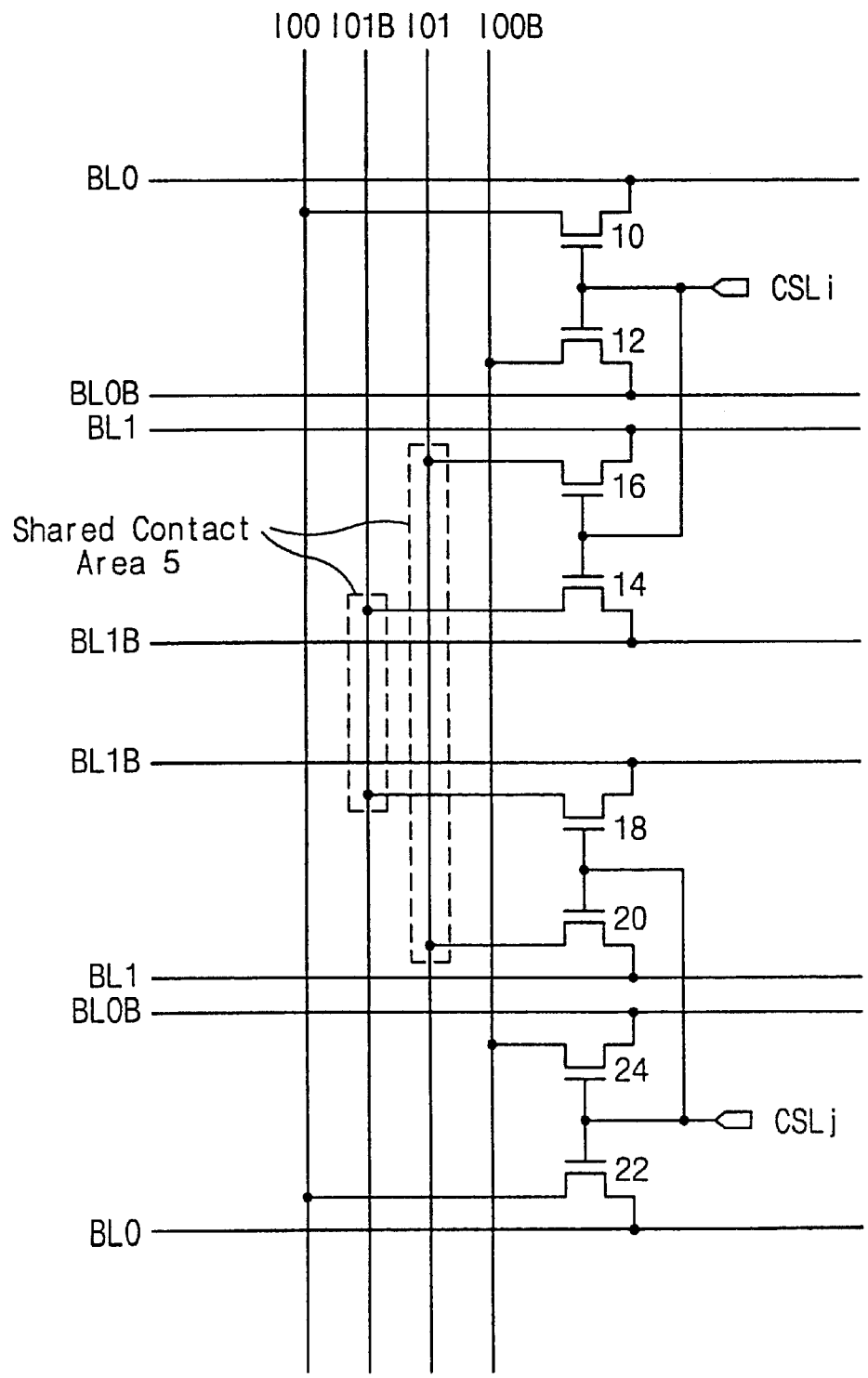
FIG. 5 shows a equivalent circuit diagram of FIG. 4.

Referring to FIG. 4, we should give attention to the fact that the selecting transistors 14 and 16 corresponding to one column selection signal CSLi (refer to FIG. 5) are laid out to share data line contacts 5 with contiguous those 18 and 20 to be selected by another column selection signal CSLj (refer to FIG. 5). So, it is possible that the selecting transistors can be laid out within a pitch Y" of (L+S+2α) less than that Y or Y' of the prior art.

Figure 3:
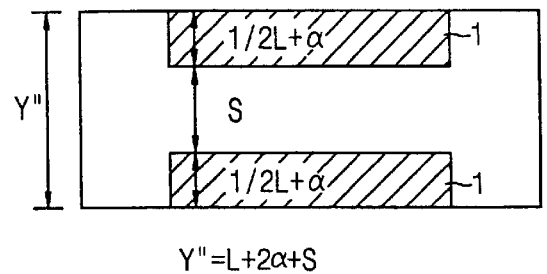
FIG. 3 shows a layout arrangement diagram of selecting transistors corresponding to a bit line pair according to the present invention.

FIG. 3 shows a present invention layout arrangement diagram of transistors for selecting bit lines (e.g., BL0 and BL1) so as to be connected to corresponding data lines (e.g., IO0 and IO0B). Active areas 1 for the selecting transistors are positioned at both edges so that a source/drain to data line contact is shared by adjacent selecting transistors. According to this layout scheme, it is possible that the selecting transistors can be laid out within a pitch of (L+S+2α). It is depicted in FIG. 4 that selecting transistors (10, 12, 14, and 16) and (18, 20, 22, and 24) corresponding to two column selection signals CSLi and CSLj (refer to FIG. 5) are laid out by using the layout scheme of FIG. 3.

In this embodiment, a DRAM device according to the present inversion uses a folded bit line scheme and a shared sense amplifier scheme as aforementioned, and two pairs of data lines IO0, IO0B, IO1, and IO1B that is, four data lines, per a memory cell array (not shown) are provided therein. The two pairs of data lines IO0, IO0B, IO1, and IO1B also may be shared by another adjacent memory cell array.

Referring to FIG. 4, four selecting transistors (or column selection transistors), that is, two pairs of selecting transistors (10 and 12) and (14 and 16) corresponding to two pairs of bit lines BL0, BL0B, BL1B, and BL1 respectively are selected simultaneously by a column selection signal CSLi (refer to FIG. 5) and the four selecting transistors 10, 12, 14, and 16 are laid out within a pitch Y" (L+S, when α is a zero) in which four pairs of bit lines, that is, eight bit lines, are laid out. Wherein, remaining two pairs of bit lines not shown in FIG. 4 are extending opposite to the two pairs of bit lines BL0, BL0B, BL1, and BL1B. Each of the selecting transistors 10, 12, 14 and 16 are formed at an active area 1 having a pitch of 1/2L, and corresponding bit lines BL0, BL0B, BL1, and BL1B are coupled via corresponding bit line contact 4 to a source/drain of each active area 1. In FIG. 4, a numeral 2 indicates a gate of each selecting transistor 10, 12, 14, and 16.

Four selecting transistors, that is, two pairs of selecting transistors (18 and 20) and (22 and 24) corresponding to two pairs of bit lines BL1B, BL1, BL0B, and BL0 are selected simultaneously by a column selection signal CSLj (refer to FIG. 5), and the four selecting transistors 18, 20, 22, and 24 are laid out within the pitch Y" of (L+S, when α is a zero). The four selecting transistors 18, 20, 22, and 24 are arranged equally to those selected by the column selection signal CSLi, and thus description thereof is omitted.

According to this layout scheme, adjacent ones (14 and 18) and (16 and 20) of the selecting transistors 10~24 controlled by the column selection signals CSLi and CSLj, respectively, share their data line contacts 5 (or their active areas 1) with each other. That is, the selecting transistors 14 and 18 share data line IO1B contact 5 and the selecting transistors 16 and 20 share data line IO1 contact 5. Although not shown in FIG. 4, remaining selecting transistors (10 and 12) and (22 and 24) share data line IO0/IO0B contacts 5 with adjacent those corresponding to another column selection signals. The layout arrangement of selecting transistors 10, 12, 14, and 16 selected simultaneously by the column selection signal CSLi is symmetrized with that of selecting transistors 18, 20, 22, and 24 selected simultaneously by the column selection signal CSLj. Also, we should give attention to the fact that bit lines BL0, BL0B, BL1, and BL1B corresponding to the column selection signal CSLi and bit lines BL1B, BL1, BL0B, and BL0 corresponding to the column selection signal CSLj are laid out (or decoded) to have a symmetrical arrangement with each other within a pitch of (L+S, when α is a zero).

An equivalent circuit diagram of four pairs of the selecting transistors 10 to 24 laid out thus is depicted in FIG. 5. As shown in FIG. 5, the selecting transistors 14 and 16 selected by a column selection signal CSLi and the selecting transistors 20 and 18 selected by a column selection signal CSLj in that order share source/drain to data line contacts 5.

Figure 6:
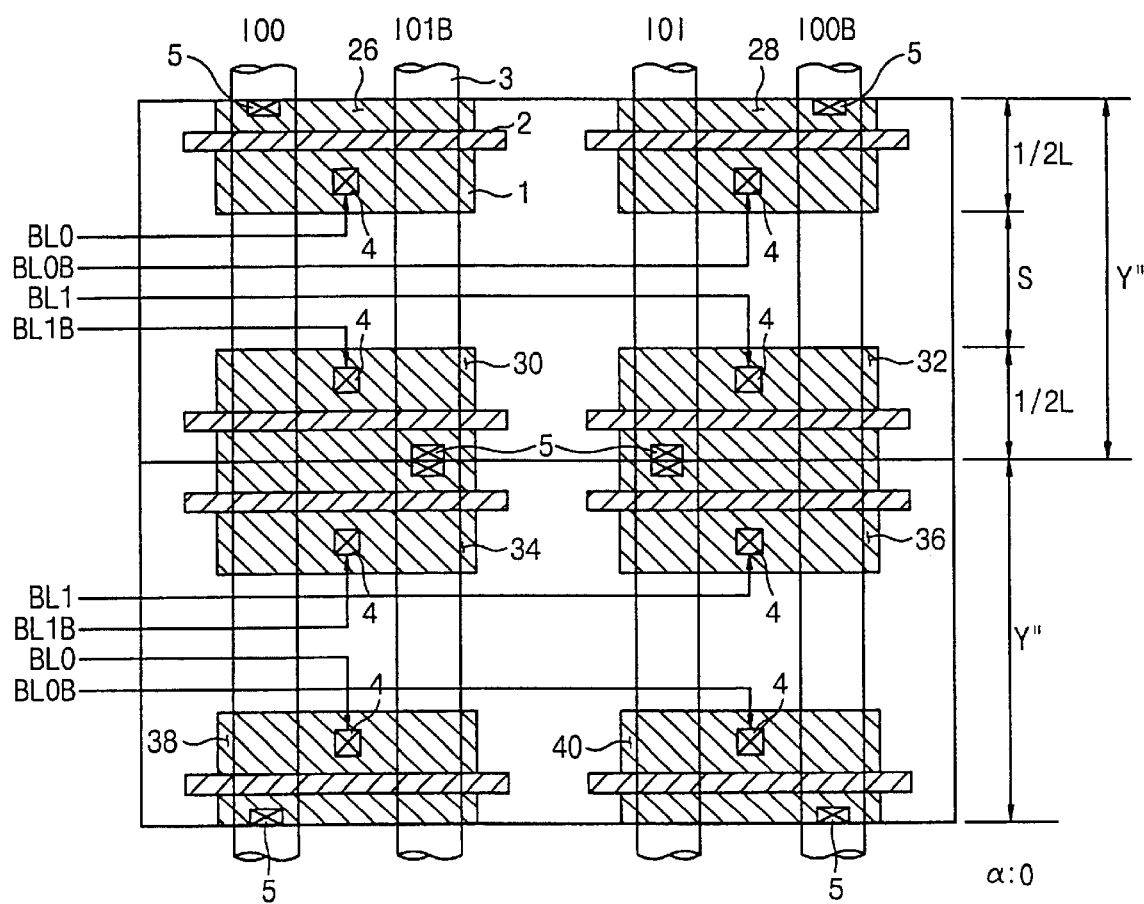
FIG. 6 shows a layout arrangement diagram of selecting transistors corresponding to two column selection signals CSLi and CSLj according to a second embodiment of the present invention.

FIG. 6 shows a layout arrangement diagram for selecting transistors 26 to 40 according to the other embodiment of the present invention. In FIG. 6, the constituent elements that are identical to those in FIG. 4 are labeled with the same reference numerals. This embodiment differs from the previous one only in that bit lines BL0, BL0B, BL1, and BL1B corresponding to the column selection signal CSLi are connected through corresponding selecting transistors 26, 28, 32, and 30 to data lines IO0, IO1, IO0B, and IO1B in that order, respectively, and bit lines BL1, BL1B, BL0, and BL0B corresponding to the column selection signal CSLj are connected through corresponding selecting transistors 36, 34, 38, and 40 to data lines IO0B, IO1B, IO0, and IO0B in that order, respectively.

That is, according to previous embodiment illustrated in FIG. 4, bit lines BL0, BL0B, BL1, and BL1B corresponding to the column selection signal CSLi are connected through corresponding selecting transistors 10, 12, 16, and 14 to data lines IO0, IO0B, IO1, and IO1B in that order, respectively, and bit lines BL1B, BL1, BL0B, and BL0 corresponding to the column selection signal CSLj are connected through corresponding selecting transistors 18, 20, 24, and 22 to data lines IO1B, IO1, IO0B, and IO0 in that order, respectively.

According to the first embodiment layout arrangement, each of bit lines BL0 and BL1 corresponding to the column selection signal CSLj is connected to a complementary cell, and each of bit lines BL0B and BL1B corresponding to the column selection signal CSLj is connected to a true cell. On the other hand, in a case of the second embodiment layout arrangement, each of bit lines BL0 and BL1 corresponding to the column selection signal CSLj is connected to a true cell, and each of bit lines BL0B and BL1B corresponding to the column selection signal CSLj is connected to a complementary cell.

Wherein, during a write mode of operation, the true cell stores an externally applied data "1" into "H" level and an externally applied data "0" into "L" level, while the complementary cell stores the data "1" into "L" level and the data "0" into "H" level.

Figure 7:
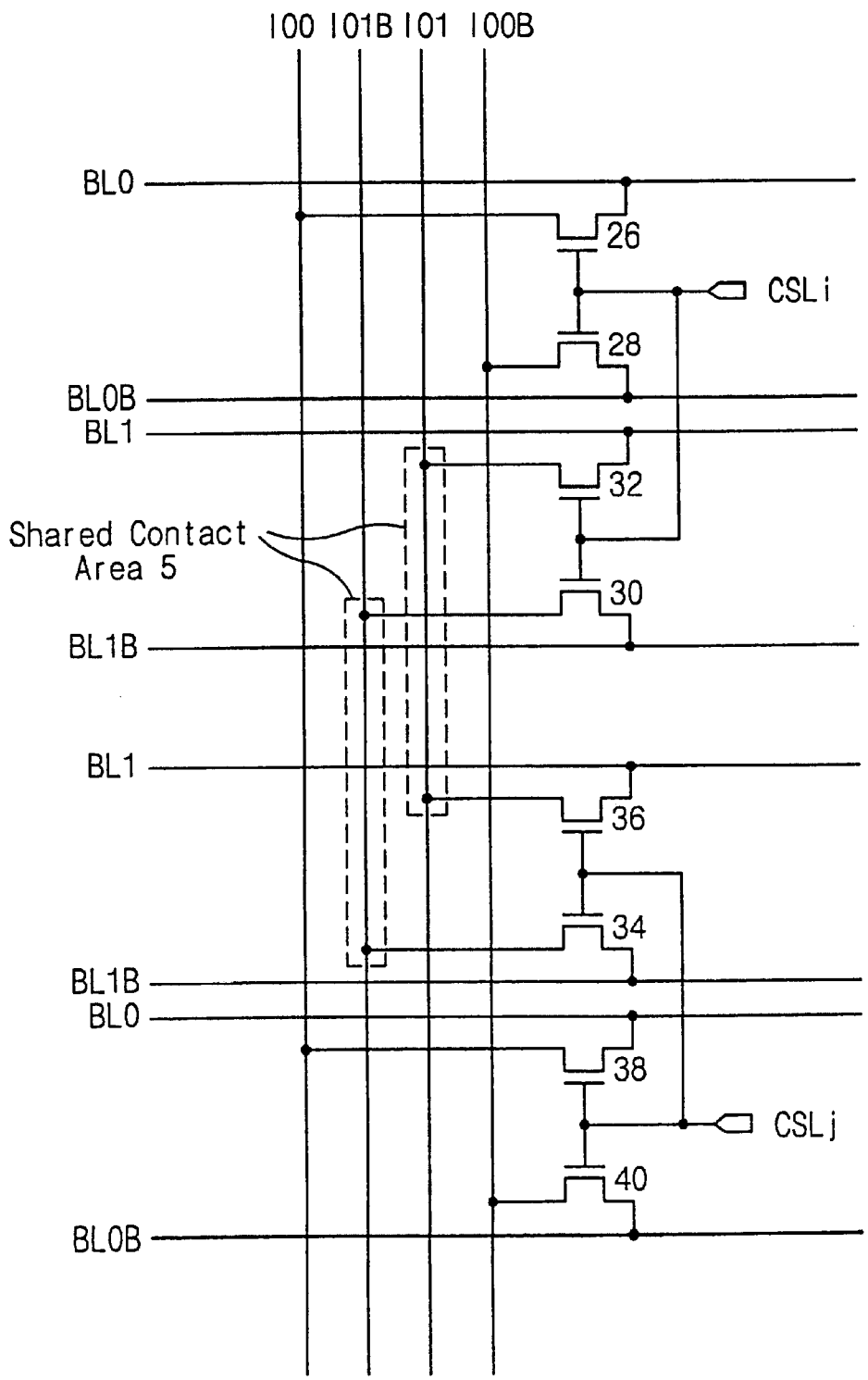
FIG. 7 shows a equivalent circuit diagram of FIG. 6.

An equivalent circuit diagram of four pairs of the selecting transistors (26 and 28), (30 and 32), (34 and 36) and (38 and 40) laid out thus is depicted in FIG. 7. As shown in FIG. 7, the selecting transistors 30 and 32 controlled by a column selection signal CSLi and the selecting transistors 34 and 36 controlled by a column selection signal CSLj share source/drain to data line contacts 5.

Figure 1:
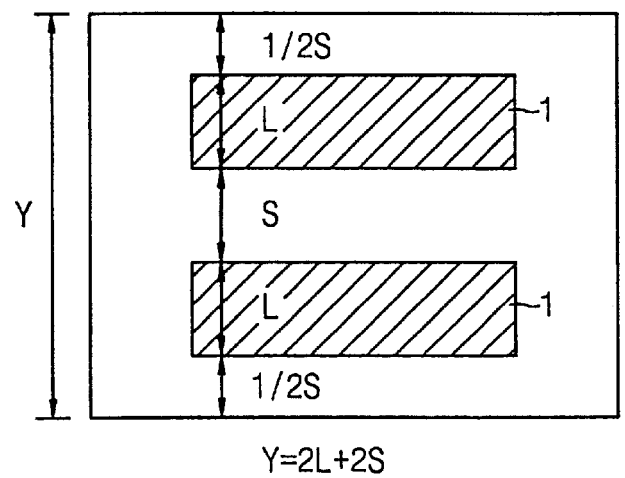
FIG. 1 shows a layout arrangement diagram of selecting transistors corresponding to a bit line pair according to a prior art.
Figure 2:
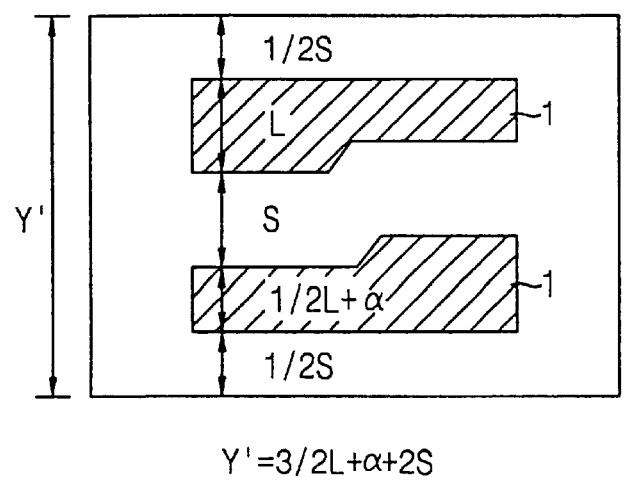
FIG. 2 shows a layout arrangement diagram of selecting transistors corresponding to a bit line pair according to another prior art.

As set forth above, according to the first and second embodiment of the present invention, the selecting transistors corresponding to the column selection signal CSLi are laid out to share source/drain to data line contacts 5 with contiguous those to be selected by another column selection signal CSLj. As this result, in case that α is a zero "0", it is ensured a fabrication process margin of (1/2L+S) with respect to a layout arrangement of FIG. 2 and of (L+S) with respect to a layout arrangement of FIG. 1, respectively. Accordingly, under the same fabrication precess capability, the selecting transistors selected by one column selection signal are laid out within a pitch of (L+S+2α) without an increment of a chip size, enabling more dies than that of the prior arts to be gained on the same wafer. Also, an effective channel widths of the selecting transistors are obtained. This is because the gates of FIGS. 4 and 6 are not bent while those of FIG. 2 are bent.

Although not shown in figures, in case that one data line pair or more than data line pairs per a memory cell array can be provided, it is obvious that selecting transistors are laid out in such a manner that selecting transistors corresponding to a column selection signal share source/drain to data line contacts with contiguous those to be selected by another column selection signal.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a memory cell array;
   first and second selection transistors that share a common drain region;
   first and second bit lines electrically connected to said memory cell array and to source regions of said first and second selection transistors, respectively; and
   a first data line electrically connected to the common drain region.

2. The memory device of claim 1, wherein said first and second selection transistors are responsive to different column selection signals.

3. The memory device of claim 2, wherein said first bit line is one of a first pair of differential bit lines; and wherein a pitch associated with a layout of said first and second selection transistors is four times a pitch of said first pair of differential bit lines.

4. The memory device of claim 2, wherein said memory cell array comprises a dynamic random access memory cell array.

5. An integrated circuit memory device, comprising:
   a memory cell array;
   first and second selection transistors that share a first common drain region but are responsive to first and second column selection signals, respectively, that are different;
   third and fourth selection transistors that share a second common drain region but and are responsive to the first and second column selection signals, respectively; and
   a first pair of differential data lines that extend opposite the first and second common drain regions.

6. The memory device of claim 5, wherein a true data line within said first pair of differential data lines is electrically connected to the first common drain region; and wherein a complementary data line within said first pair of differential data lines is electrically connected to the second common drain region.

7. The memory device of claim 6, further comprising:
   a first pair of differential bit lines electrically coupled to said memory cell array and to the source regions of said first and third selection transistors; and
   a second pair of differential bit lines electrically coupled to said memory cell array and to the source regions of said second and fourth selection transistors.

* * * * *